United States Patent [19]
Goulding et al.

[11] Patent Number: 4,658,216
[45] Date of Patent: Apr. 14, 1987

[54] HIGH RESOLUTION, HIGH RATE X-RAY SPECTROMETER

[75] Inventors: Frederick S. Goulding, Lafayette; Donald A. Landis, Pinole, both of Calif.

[73] Assignee: The United States of America as represented by the Department of Energy, Washington, D.C.

[21] Appl. No.: 513,557

[22] Filed: Jul. 14, 1983

[51] Int. Cl.⁴ .................. H03K 5/22; H03K 3/017
[52] U.S. Cl. .................... 328/109; 328/114; 307/234; 307/265
[58] Field of Search ............ 328/111, 112, 114, 109, 328/116, 127, 133, 132, 135, 181; 307/234, 265, 240–243, 228

[56] References Cited

U.S. PATENT DOCUMENTS

| | | |
|---|---|---|
| 3,413,412 | 11/1968 | Towsend .................. 307/234 |
| 3,528,019 | 9/1970 | Inoue ..................... 328/112 |
| 3,555,434 | 1/1971 | Sheen ..................... 307/520 |
| 3,705,358 | 12/1972 | Bauman et al. ............. 307/234 |
| 3,735,271 | 5/1973 | Leibowitz ................. 307/234 |
| 4,497,068 | 1/1985 | Fischer ................... 307/234 |

Primary Examiner—Stanley D. Miller
Assistant Examiner—Timothy P. Callahan
Attorney, Agent, or Firm—Clifton E. Clouse, Jr.; Roger S. Gaither; Judson R. Hightower

[57] ABSTRACT

A pulse processing system (10) for use in an X-ray spectrometer in which a main channel pulse shaper (12) and a fast channel pulse shaper (13) each produce a substantially symmetrical triangular pulse (f, p) for each event detected by the spectrometer, with the pulse width of the pulses being substantially independent of the magnitude of the detected event and with the pulse width of the fast pulses (p) being substantially shorter than the pulse width of the main channel pulses (f). A pile-up rejector circuit (19) allows output pulses to be generated, with amplitudes linearly related to the magnitude of the detected events, whenever the peak of a main channel pulse (f) is not affected by a preceding or succeeding main channel pulse, while inhibiting output pulses wherein peak magnitudes of main channel pulses are affected by adjacent pulses. The substantially symmetrical triangular main channel pulses (f) are generated by the weighted addition (27–31) of successive RC integrations (24, 25, 26) of an RC differentiated step wave (23). The substantially symmetrical triangular fast channel pulses (p) are generated by the RC integration (43) of a bipolar pulse (o) in which the amplitude of the second half is 1/e that of the first half, with the RC time constant of integration being equal to one-half the width of the bipolar pulse.

14 Claims, 6 Drawing Figures

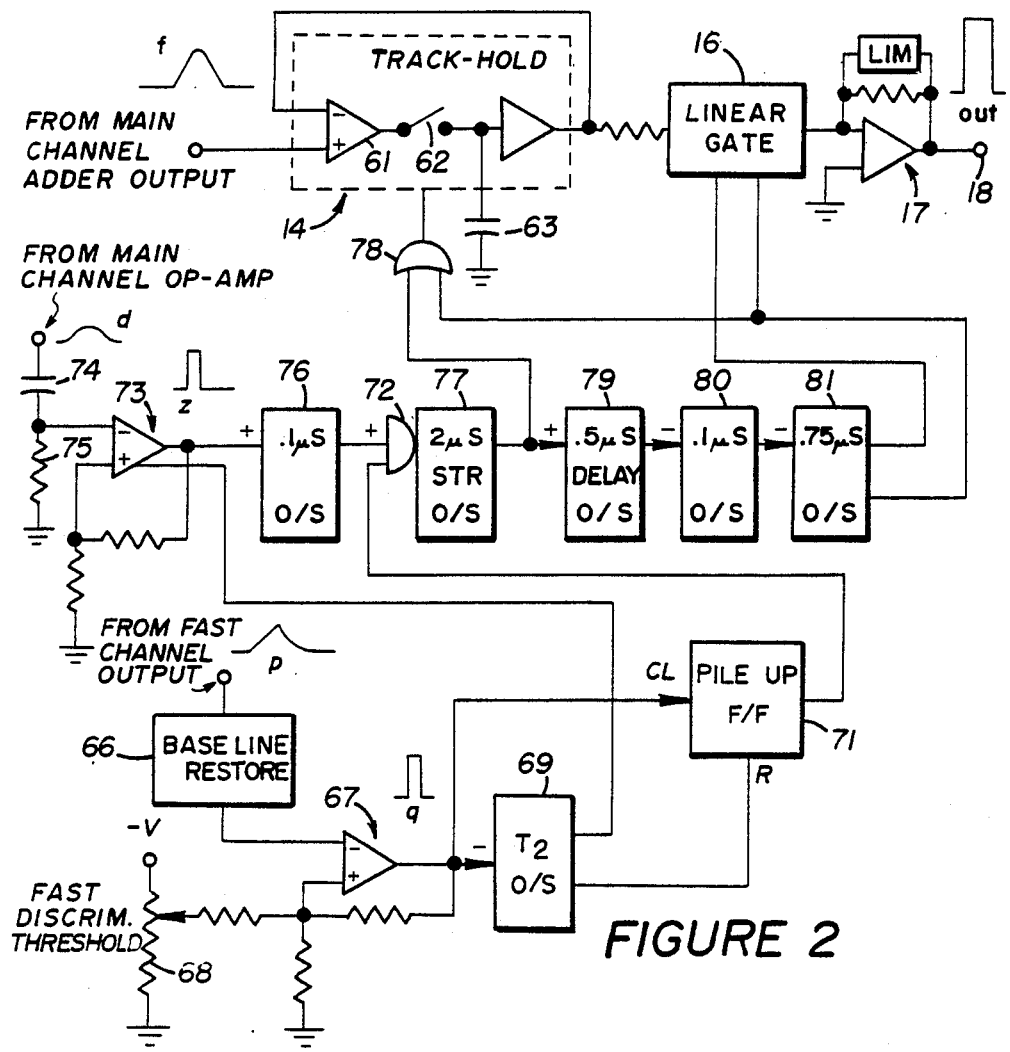
FIGURE 2
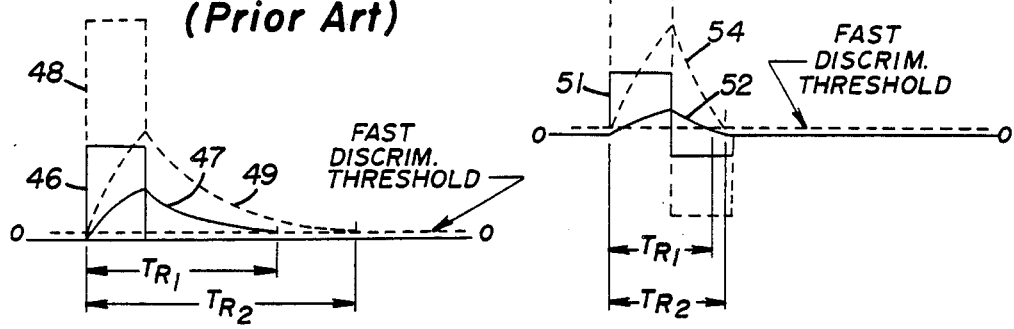
FIGURE 3
(Prior Art)
FIGURE 4

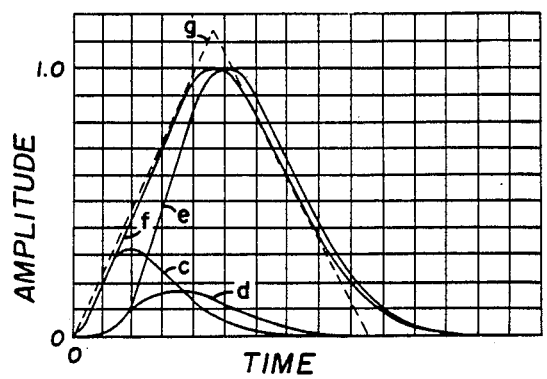
FIGURE 5
FIGURE 6
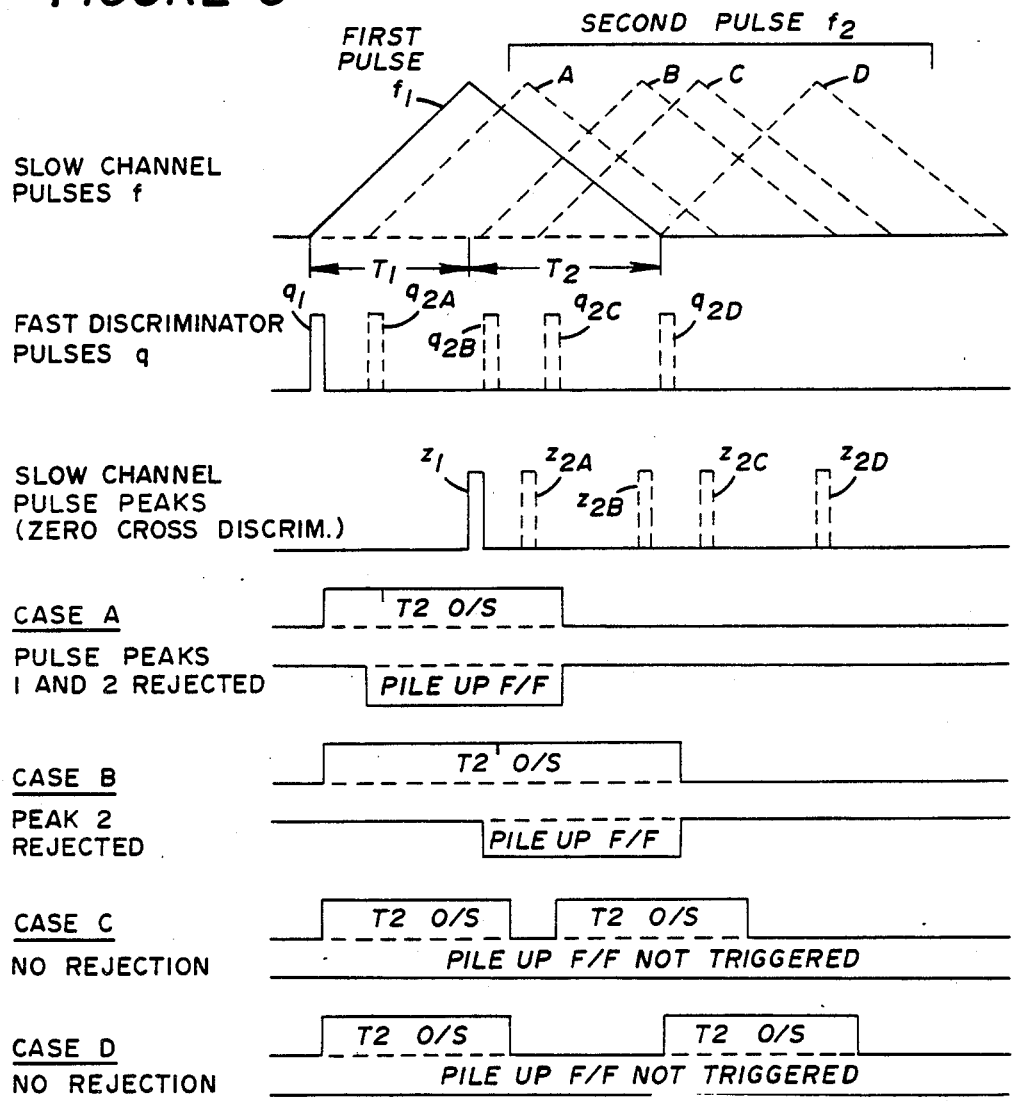

HIGH RESOLUTION, HIGH RATE X-RAY SPECTROMETER

BACKGROUND OF THE INVENTION

The present invention relates generally to high resolution, high rate x-ray spectrometers and more particularly to systems for processing the pulses which are generated in response to detected radiation. The United States Government has rights in this invention pursuant to Contract No. DE-ACO3-76SF-00098 between the U.S. Department of Energy and the University of California.

The pulse processing system of the present invention was designed in response to the need for an x-ray spectrometer capable of use in plasma diagnostics in a fusion reactor. High temperature plasmas produced in such reactors emit considerable black body radiation in the x-ray energy level up to several tens of kilovolts. Measurement of this flux is important in determining the plasma temperatures and in detecting the presence of impurities which produce characteristic x-ray lines.

In such diagnosis, spatial and temporal variations in the radiant energy must be measured. Since temporal variations during the plasma pulse must be observed on a millisecond time scale, the solid angle of the detectors observing the plasma must be large enough to give counting rates adequate for statistically meaningful spectra to be accumulated on a time scale of a few milliseconds.

The combination of very high counting rates and the excellent energy resolution requirement for the observation and separation of impurity spectral lines presents very difficult design problems. The final usefulness of the spectrometer requires that a high rate of analyzable pulses be passed by the signal processing system. Rejection of detected events must be minimized and a high throughput must be realized.

As a further complication, since the whole purpose of a fusion reactor is to produce thermonuclear reactions, the spectrometer must cope with significant production of 14 MeV neutrons. The estimated maximum flux of such neutrons through the spectrometer detectors is in the order of 5000/second. Such neutrons will interact by colliding with the silicon or germanium nuclei in the semiconductor detectors, with resulting signals ranging up to a few MeV. The signal processing system must be able to handle the large signals and recover very quickly to process the x-ray signals in the energy range from 1 keV to 50 keV.

Typically, the semiconductor detectors will detect single radiation events (photons or charged particles) and produce impulses of current into a preamplifier which will output detected signals as step waveforms. These signals will then be processed by pulse shaping circuits to provide pulses having an optimal signal-to-noise ratio and having amplitudes which are linearly relates to the energy absorbed by the detectors due to the detected events. To cope with high counting rates, the total width of the pulses must be minimized.

In the environment for which the present invention is intended, the very short pulse widths involved make series (delta) noise, i.e. the "shot" noise of the input amplifier, the dominant noise in the pulse shaping system.

It is known that series (delta) noise is dependent on the rate of change of the step response in the shaping system. It is also known that a symmetrical triangular pulse will have a minimum and constant slope for a given amplitude and will thus have an optimum shape for increasing the signal-to-noise ratio. Any other pulse shape, such as the Gaussian shape commonly produced in existing pulse shaping circuits will have a poorer signal-to-noise ratio since a pulse with a lower slope along some portion of its length must have a higher (and noiser) slope along another portion if it is to reach to the same maximum amplitude in the allotted time.

Although it has been known that symmetrical triangle pulse shaping would be beneficial in reducing series (delta) noise, suitable apparatus for producing such pulses of the character necessary for use in the present invention has not been heretofore devised.

Symmetrical triangle pulse generation has been achieved by proper integration of a symmetrical biphase delay line pulse, but such delay lines are bulky, are not easily varied in their time scale, and cause severe sensitivity of gain to temperature variations. As a consequence, they are not practical circuit elements for the main channel of a pulse processing system.

All modern spectrometer pulse processors use a method to prevent the analysis of pulses whose amplitude is subject to interference by other signals in close time proximity. Generally speaking, this function is achieved by a "pile-up rejector" containing four elements: (a) a gate at the output of the main pulse processing channel; (b) a parallel fast inspection channel where a short duration signal is generated in response to each detected event; (c) a fast discriminator which produces a logic signal having an output width corresponding to the time that the fast inspection channel pulses exceed the fast discriminator threshold level; and (d) a pile-up detector which examines the fast discriminator logic signals, and, by measuring the time between these signals, senses whether two main pulses may distort the signal amplitude of each other—if not, both of the main pulses are gated through to an output; if so, one or both pulses are not gated through.

The accuracy of the pulse processor will depend to a large extent on the "resolving time" of the system, i.e. on the width of the logic signal outputted by the fast discriminator, which width is determined by the length of time that the fast channel pulses exceed the fast discriminatory threshold level. If two detected events occur within this resolving time, the fast inspection channel cannot recognize them as separate signals and both main channel pulses will be gated through together to the output. This will result in a number of output pulses whose amplitude is the sum of two (or more) separate signals, causing the output spectrum to contain "sum" peaks. In the present environment, these sum peaks will distort the thermal black body spectrum seen from hot plasma discharges because some counts that should appear in the intense low energy part of the spectrum will be shifted into the weak high energy part of the spectrum. Such distortion of the black body radiation will affect the measurement of the plasma temperature.

If the resolving time were constant and reasonably well known, an approximate correction could be applied to the continuum spectrum to compensate for this type of pulse pileup. Unfortunately, existing spectrometers fall far short of meeting the criteria of providing a well determined and consistent resolving time. Typically the fast channel pulses are produced by integration or with a single delay line or simple RC pulse shaping.

As a consequence there will be a long exponential tail on the back edge of the fast channel signal waveform, causing the resolving time to be very dependent on pulse amplitude. Such shapes of existing fast channel pulses are thus not desirable in environments where a wide and unknown dynamic range of pulse amplitudes is to be measured.

In addition, most existing systems are disadvantageous in that they provide fast channel pulse shaping having a poor signal-to-noise ratio, requiring the fast discriminator level to be set at a high level in order to reduce noise triggering.

In order to achieve maximum throughput, the system should operate to gate all main channel pulses through which do not actually distort each other. At times a second main channel pulse will begin during the time that the preceding main channel pulse is decreasing from its peak, with the peak of the second pulse occurring after the first pulse has ended. Desirably the peaks of both of these main channel pulses should be gated through to the output since neither peak is affected by the other. However, existing systems do not permit this, generally because of the fact that the main channel pulse stretcher waits until the tail of the first pulse reaches a low threshold level before permitting the stretching of a normal pulse.

SUMMARY OF THE INVENTION

It is an object of the invention to provide a pulse processing system for use with detected signals of a wide dynamic range which is capable of very high counting rates, with high throughput, with excellent energy resolution and a high signal-to-noise ratio.

It is a further object of the invention to provide a pulse processing system wherein the fast channel resolving time is quite short and substantially independent of the energy of the detected signals.

Another object of the invention is to provide a pulse processing system having a pile-up rejector circuit which will allow the maximum number of non-interfering pulses to be passed to the output.

It is also an object of the invention to provide new methods for generating substantially symmetrically triangular pulses for use in both the main and fast channels of a pulse processing system.

Additional objects, advantages and novel features of the invention will be set forth in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the present invention, as embodied and broadly described herein, a pulse processing system is provided, such system having a first pulse generator for generating substantially symmetrical triangular main pulses in response to detected signals, the triangular pulses having amplitudes proportional to the magnitudes of the detected signals and substantially constant total pulse widths, a second pulse generator for generating substantially symmetrical triangular fast channel pulses in response to the detected signals with the pulse widths of the fast channel pulses being substantially constant, substantially shorter than the main channel pulses, and substantially independent of the magnitude of the detected signals, and a pulse rejector system which will allow the peaks of successive main channel pulses through whenever the time duration between fast channel pulses is greater than a time which is equal to the longest of the rise or fall of the main channel pulses.

In order to generate substantially symmetrical triangular pulses in the main channel of the pulse processing system, a differentiated waveform generated in respone to a step waveform of a detected signal is successively integrated by active RC integrators, and a weighted addition of three successive integrated waveforms is used.

In order to generate substantially symmetrical triangular pulses in the fast channel of the pulse processing system in response to step function waveforms from detected signals, a single rectangular pulse is produced for each step function waveform, a bipolar pulse is then produced with the amplitude of the second half of the pulse being approximately 1/e times that of the first half of the pulse, and the bipolar pulse is than integrated with the RC integration time being equal to one-half the width of the bipolar pulse.

BRIEF DESCRIPTION OF THE DRAWINGS

The accompanying drawings, which are incorporated in and form a part of the specification, illustrate an embodiment of the invention and, together with the description, serve to explain the principles of the invention.

FIG. 2 is a circuit diagram of the pile-up rejector portion of the invention.

FIGS. 3 and 4 illustrate the fast channel pulse shapes in a conventional prior art system and in the present invention, respectively.

FIG. 5 illustrates the shapes of the waveforms at various points in the main channel pulse shaper.

FIG. 6 illustrates the functioning of the pile-up rejector portion of the present invention.

DETAILED DESCRIPTION OF THE INVENTION

Figure 1:
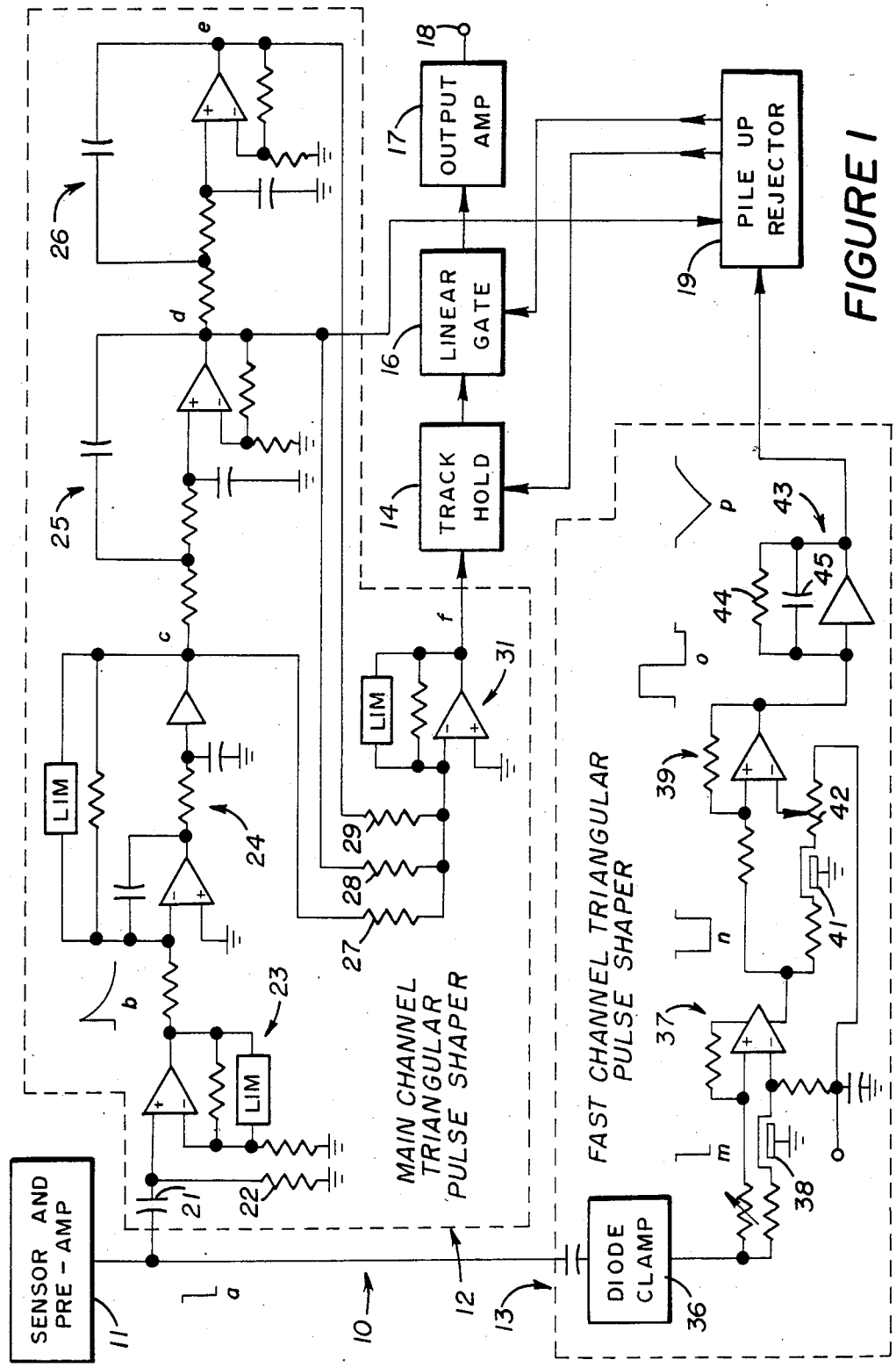
FIG. 1 is a block and circuit diagram of a pulse processing system made in accordance with the invention.

Referring now to the drawings, which illustrate a preferred embodiment of the invention, the pulse processing system 10 of the present invention is shown in conjunction with a sensor and preamplifier 11 of an x-ray spectrometer. The sensor and preamplifier 11 is shown only in block for since the details thereof are not part of the present invention. Typically, for plasma diagnostics, the sensor will include semiconductor crystals of germanium and silicon. Because of its great mass, the germanium will be effective in the absorption of high energy radiation, with the use of silicon being more advantageous at lower energy levels.

The output of the preamplifier will be a series of step waveform signals (a) whose amplitude is linearly related to the amount of energy absorbed due to each detected event.

Each signal (a) is then applied to the main channel triangular pulse shaper 12 and the fast channel triangular pulse shaper 13. As will be brought out in more detail below, the main channel triangular pulse shaper will generate a substantially symmetrical triangular pulse (f) for each detected signal (a), with each pulse (f) having a substantially constant pulse width and an amplitude linearly related to the magnitude of the detected signal (a).

At the same time, each detected signal (a) is also applied to the fast channel triangular pulse shaper 13 which generates a substantially symmetrical triangular pulse (p) for each detected signal, the pulses (p) having a substantially constant pulse width which is essentially independent of the magnitudes of the detected signals (a) and which is much shorter (e.g. in the order of 1/50 th) than the pulse width of the main channel pulses (f).

The main channel pulses f are applied to a "track-hold" circuit 14 which functions to follow the pulses (f) and hold the peak value thereof. This held value is then passed through a linear gate 16 and amplified by output amplifier 17 so that an output pulse is produced at output 18, with the amplitude of the output pulse being linearly related to the energy level of the detected event. The output pulses will then be sent to a pulse-height analyzer (not shown) where the amplitude spectrum of the output pulses will be determined.

The fast channel pulses (p) are applied to a pile-up detector circuit 19 which controls the track-hold and linear gate circuits 14 and 16 so that only non-interfering main channel pulse peaks will be passed through to the output 18.

The main channel triangular pulse shaper 12 functions to produce a substantially symmetrical triangular pulse by a weighted mixing of the outputs of stages that are already present in shaping amplifiers used to produce Gaussian pulse shapes, and thus uses convenient active integrators whose behavior is suitable for stable amplifiers (unlike delay lines).

In particular, the step waveform (a) is first applied to the capacitor 21 and resistor 22 of the operational amplifier 23 which functions as a differentiator to produce the differentiated waveform (b). The differentiated waveform is then successively integrated by operational amplifier integrating stages 24, 25 and 26. The integrating stage 24 functions as an inverting stage while stages 25 and 26 are of the non-inverting type. Analytically, the stages are analogs of each other, all having their poles about 27.3° off the real axis.

The waveforms (c), (d) and (e) from the outputs of the integrator stages 24, 25 and 26 are then applied through weighting resistors 27, 28 and 29 to adder 31. Preferably, the resistors 27, 28 and 29 are chosen in value so that the outputs of the three integrator stages are mixed in the ratio of 0.324:0.168:1. FIG. 5 shows the three component waveforms (c), (d) and (e), with amplitudes corresponding to the weighting, and the resulting substantially symmetrical triangular wave (f) produced by adding these three components and normalized to unity amplitude. A true symmetrical triangle (g), closely matching the sides of waveform (f) is also shown in FIG. 5.

As is indicated in FIG. 5, the actual output waveform (f) departs from a true symmetrical triangle (g) in two significant respects. First, the peak is rounded. This factor increases the parallel (step) noise slightly but is also a necessary feature for good operation of the pulse stretcher used at the output of the main channel of the system. Since parallel noise is negligible in the present system, virtually no loss of performance results from the rounded peak.

Secondly, a slightly rounded tail occurs on the output pulse (f). This is undesirable since it increases slightly the pulse pile-up effects, but is unavoidable using passive (i.e. time-invariant) networks. A choice of the integrator and differentiator stages 23, 24, 25 and 26 is based on minimizing this effect.

The effect of the present invention on noise performance can be shown by comparing the waveform (f) of the present system with the performance of a system producing the quasi-Gaussian waveform (e) which is typical of the pulse shapes of many present spectroscopy systems, bearing in mind that the integral of the slope is the important factor is series (delta) noise. There is little difference between waveforms (e) and (f) on the falling part of those waveforms, but the rising slope of waveform (f) is essentially constant and much less than the steepest part of the rising slope of waveform (e). This avoidance of excess slope in the fundamental reason for the improved delta noise of the present invention. Approximately 8% improvement in delta noise can be obtained.

In the fast channel 13, each step signal (a) is applied through a diode clamp 36 to the inputs of operational amplifier 37. With delay line 38 in the negative input, amplifier 37 will perform a subtractive operation between the input step function waveform (m) from the diode clamp 36 and a delayed version of that input. The resulting output from amplifier 37 is a single phase rectangular pulse (n). This pulse is than applied to the inputs of operational amplifier 39, with delay line 41 and variable resistor 42 functioning so that the amplifier 39 performs a subtraction between waveform (n) and a delayed and adjustable amplitude version of waveform (n) which is delayed by its width. The output of amplifier 39 is a bipolar pulse (o), whose second half amplitude is 1/e times that of its first half, "e" being the base of the natural logarithmic system.

The bipolar pulse (o) is then applied to integrator stage 43 having values of resistor 44 and capacitor 45 such that the RC time constant is equal to one-half the width of bipolar pulse (o). The resulting output of integrator 43 is a waveform (p) having a substantially symmetrical triangular shape.

As illustrated in FIGS. 3 and 4, the shape of the fast channel pulses (p) will enable to system to have a very short and substantially constant resolving time as compared with existing spectroscopy systems.

Typically, existing systems use inherent integration (usually in the preamplifier) and single delay line or simple RC pulse shaping wherein a single phase pulse 46 is integrated to form a fast pulse 47 having a long exponential tail on the back edge of the waveform. As mentioned before, the resolving time of the fast channel is the time when the amplitude of the fast channel pulses exceeds the discriminator threshold level. In FIG. 3, the resolving time for the fast channel pulse 47 is indicated by $T_{R1}$. If the single phase pulse 48 has a greater amplitude (because of a greater magnitude of detected event), the corresponding fast pulse 49 will have a greater amplitude, causing a significantly longer time for exponential decay to the fast discriminator threshold level and resulting in a substantially greater resolving time $T_{R2}$.

As is seen in FIG. 4, in the present invention the magnitude of the first halves of the bipolar pulses 51 and 52 will likewise cause the magnitude of the corresponding fast pulses 53 and 54 to vary in accordance with the magnitude of the detected event. However, the negative second halves of the bipolar pulses 51 and 52 will force a quicker decay of the fast pulses 53 and 54. As shown in FIG. 4, the fast pulses 53 and 54 both decay to the zero baseline at a time equal to the total bipolar pulse width, causing the resolving times $T_{R1}$ and $T_{R2}$ to be substantially the same for greatly varying energy levels in the detected signals. As may be seen, such resolving times are considerably less than the resolving times shown in FIG. 3.

Also, as described in connection with the main channel 12, the symmetrical triangular shape of the fast pulses will give the best signal-to-noise ratio where series (delta) noise is dominant, as is always the case in the fast channel 13. The reduction in noise is advantageous since it enables the fast discriminator threshold level to be maintained at a relatively low level without noise triggering, thereby enabling the system to be used with relatively weak levels of detected energy.

The pile-up rejector portion 19 of the present invention is shown in more detail in FIG. 2. As mentioned before, the symmetrical triangular waveforms (f) from adder 31 are applied to amplifier 61 of track-hold circuit 14. Normally, switch 62 maintains the hold capacitor 63 connected to the output of amplifier 61 so that the voltage across the hold capacitor 63 will follow the rising and falling voltage of the waveform (f).

When a detected event occurs, a fast channel pulse (p) will be applied through the base line restore circuit 66 to the input of the fast discriminator 67, causing an output pulse (q) therefrom having a pulse width equal to the time that the magnitude of the fast signal (p) exceeds the fast discriminator threshold set by variable resistor 68. The base line restore circuit 66 functions in a conventional manner to maintain the baseline of the fast pulses at zero. The trailing edge of the fast discriminatior pulse (q) will trigger the $T_2$ one-shot 69 to generate a single pulse lasting for a time $T_2$, which time is chosen to be equal to the longest of the rise or fall times of a slow channel triangular pulse (f).

Normally, the $T_2$ one-shot 69 holds the pile-up flip-flop 71 in reset condition so that its output applies a high input to AND gate 72. When the $T_2$ one-shot pulses, the reset voltage is removed from flip-flop 71. If there is another fast discriminator pulse (q) during the $T_2$ one-shot pulse, the leading edge of that fast discriminator pulse can clock the flip-flop, causing the output thereof to go low.

When not pulsing, the $T_2$ one-shot 69 prevents the zero-cross discrimination 73 from operating so that it cannot respond to noise, but enables such operation during the time duration of the $T_2$ pulse.

The output from integrator stage 25 of the main channel is applied through an RC differentiator (capacitor 74 and resistor 75) to the input of the zero-cross discriminator 73 which produces a peak sensing signal (z) at the time when the main channel waveform (f) reaches peak value. The peak sensing signal (z) triggers the 0.1 microsecond one-shot 76, which in turn applies a high output to AND gate 72. A high output of AND gate 72 will trigger the two-microsecond stretch one-shot 77 whose output is then applied for two microseconds through OR gate 78 to open switch 62. The opening of switch 62 occurs when the slow channel waveform (f) peaks, and this peak voltage will then be held by capacitor 63 until switch 62 is later closed.

The two microsecond output pulse from the stretch one-shot 77 will sequentially trigger the 0.5 microsecond delay one-shot 79, the 0.1 microsecond one-shot 80, and the 0.75 microsecond one-shot 81. The outputs of the latter one-shot are connected to linear gate 16 so that 0.5 microseconds after the main channel pulse (f) has peaked, linear gate 16 will operate for 0.75 microseconds to pass the peak voltage held by capacitor 63 through to the output amplifier 17. The pulse from the 0.75 microsecond one-shot 81 is also applied through the OR gate 78 to ensure that switch 62 is held open during operation of linear gate 16.

FIG. 6 illustrates the manner in which the present system will inhibit interfering output pulse peaks while allowing the maximum of non-interfering pulse peaks to pass through. In particular, FIG. 6 illustrates the occurrence of a first main channel pulse ($f_1$) and a second main channel pulse ($f_2$) occurring at four different times after the first main channel pulse. To simplify the diagram, an asymmetrical triangular waveform is shown, with a rise time of $T_1$ and a somewhat longer fall time of $T_2$.

Case A represents a situation wherein the start of the second main channels pulse ($f_2$) occurs during the rise time of the first pulse ($f_1$) and the peak of the second pulse occurs during the fall time of the second pulse. It is clear that the peak amplitudes of both the first and second pulse ($f_1$) and ($f_2$) are each affected by the other pulse, so that both pulse peaks must be rejected to prevent pulse interferences.

As described above, the fast channel pulse (p) corresponding to the first main channel pulse will cause the fast discriminator 67 to generate pulse ($q_1$), to trigger $T_2$ one-shot 69. The pulse from one-shot 69 enables the zero-cross discriminator 73 and removes the reset voltage from pile-up flip-flop 71. With the next detected event ocurring during the rise of the first main channel pulse ($f_1$), a second fast channel pulse will be generated and a second fast discriminative pulse ($q_{2A}$) will be produced. Since this second fast discriminator pulse ($q_{2A}$) occurs during the $T_2$ one-shot pulse, the front edge of the second fast discriminator pulse ($q_{2A}$) will clock the flip-flop 71, causing it to output a low to AND gate 72. This low will be maintained until flip-flop 71 is again reset. The rear edge of the second fast discriminator pulse ($q_{2A}$) will retrigger the $T_2$ one-shot 69.

In due course the zero-cross discriminator will generate pulse ($z_1$), when the first main signal ($f_1$) peaks. However, with the pile-up flip-flop 71 holding AND gate 72 closed, the two microsecond stretch one-shot 77 will not be triggered. Likewise, linear gate 16 will not be enabled.

During the retriggered operation of the $T_2$ one-shot 69, the zero-cross discriminator will generate pulse ($z_{2A}$) at the time that the second main channel pulse ($f_{2A}$) peaks. However, since this will occur during $T_2$ time, the clocked flip-flop 71 will prevent the stretch one-shot 77 from being triggered by the second zero-cross discriminator pulse ($z_{2A}$).

In due course, if no further detected signal occurs, the $T_2$ one-shot will time out to reset the pile-up flip-flop 71, and thereby enable the AND gate 72.

Case B represents a situation wherein the second main channel pulse ($f_{2B}$) starts after the peak of the first pulse ($f_1$) and peaks during fall of the first pulse. In such case, the peak of the first pulse will not be affected by the second pulse, but the peak of the second pulse will be affected by the first pulse. In this case it is desired to have an output pulse corresponding to the peak of the first main pulse ($f_1$) while inhibiting an output pulse corresponding to the peak of the second main pulse ($f_{2B}$).

The first fast pulse will cause a first fast discriminator pulse ($q_1$), the trailing edge of which triggers the $T_2$ one-shot 69. In due course, the zero-cross discriminator 73 will generate pulse ($z_1$) when the first main signal ($f_1$) peaks. Since the pile-up flip-flop 71 has not yet been clocked by the second fast discriminator pulse ($q_{2B}$), the zero cross discriminator pulse ($z_1$) will trigger the stretch one-shot 77 and cause the peak of the first signal ($f_1$) to be gated through to the output amplifier 17.

The second fast discriminator pulse ($q_{2B}$), coming during the $T_2$ one-shot pulse, will clock the pile-up flip-flop 71 and retrigger the $T_2$ one-shot pulse. Accordingly, the AND gate 72 will be closed against the second zero-cross discriminator pulse $z_{2B}$ and no output pulse will be produced by the second main channel pulse ($f_{2B}$).

In case C, the second main channel pulse ($f_{2C}$) starts after the peak of the first pulse ($f_1$) and peaks after the first pulse ends. In this case, neither pulse interferes with the peak of the other pulse and output signals corresponding to both peaks should be produced.

In the present system, the zero-cross discriminator pulse ($z_1$) for the first main pulse occurs during time $T_2$ and before the second first discriminator pulse ($q_{2C}$). As a consequence, the pile-up flip-flop 71 will hold AND gate 72 high so that the first zero-cross discriminator pulse ($z_1$) will trigger the stretch one-shot 77 and cause the linear gate 16 to operate.

The second fast discriminator pulse ($z_{2C}$) will occur after the $T_2$ one shot 69 has timed out (which in turn caused reset voltage to be applied to flip-flop 71). With flip-flop 71 now held in reset condition, it cannot be clocked by the second fast discriminator pulse ($q_{2C}$). Instead, the trailing edge of the second fast discrimination pulse triggers the $T_2$ one-shot 69. The zero-cross discriminator is again enabled to generate pulse ($q_{2C}$) at the peak of the second main channel pulse ($f_{2C}$) and to trigger the stretch one-shot 77 so that an output pulse will be produced with an amplitude corresponding to the magnitude of the second main channel pulse ($f_{2C}$).

Case D is a situation wherein the second main pulse ($f_{2D}$) does not begin until after the first main channel pulse ends. Since neither pulse affects the peak of the other, separate output pulses should be allowed through.

Since the second fast discriminator pulse ($q_{2D}$) does not occur until after the first pulse of the $T_2$ one-shot 69, then the system will operate in the same manner as described in connection with case C.

Thus, with the present invention, separate output pulses will be produced whenever there is more than $T_2$ time between the peaks of the two pulses. With $T_2$ being slightly more than the rise time of the main pulses, then the throughput of the system can be as much as 40% greater than previous systems which allowed separate pulses through only if the second main pulse began after the first main pulse ended.

The present system also utilizes feedback limiters in the amplifying stages, one of the integrator stages and in the final output stage. These feedback limiters play an important role in minimizing the system recovery time following large overload pulses produced by fast neutrons in the detectors.

The foregoing description of a preferred embodiment has been presented for purposes of illustration and description. It is not intended to be exhaustive or to limit the invention to the precise form described, and obviously many modifications and variations are possible in light of the above teaching. The embodiment was chosen and described in order to best explain the principles of the invention and its practical application to thereby enable others in the art to best utilize the invention in various embodiments and with various modifications as are suited to the particular use contemplated.

The above description has been directed to a pulse processing system in an X-ray spectrometer for measuring plasma-temperatures and detecting impurities in a high temperature fusion test reactor, and in this intended use the system meets the requirements of high counting rate and increased throughput, high signal-to-noise ratio, large dynamic range, and excellent resolution in the presence of a high energy neutron background. However, the systems of the present invention can also be used in other instruments wherein some or all of these advantages are needed. It is intended that the scope of the invention be defined by the claims appended hereto.

We claim:

1. A system for processing pulses generated in response to detected signals of differing magnitudes, said system comprising;

a main channel pulse shaping means for generating a substantially symmetrical triangular main channel pulse in response to each detected signal, said main channel pulses having amplitudes proportional to the magnitudes of said detected signals, said main channel pulses each having a substantially constant pulse width, a fast channel pulse shaping means for generating a substantially symmetrical triangular fast channel pulse in response to each detected signal, said fast channel pulses each having a substantially constant pulse width which is substantially independent of the magnitudes of the detected signals and which is substantially less than the pulse width of the main channel pulses, output means for receiving said main channel pulses and for generating output pulses corresponding to said main channel pulses, with the amplitudes of the output pulses being proportional to the amplitude of the main channel pulses to which they correspond.

pile-up rejector means for receiving said fast channel pulses and for allowing said output means to generate two successive output pulses corresponding to two successive main channel pulses whenever the time duration between the corresponding fast channel pulses, which are generated in response to the same detected signals that cause the two successive main channel pulses to be generated, is greater than a time which is equal to the longest of the rise or fall times of the main channel pulses.

2. A system as set forth in claim 1 wherein said pile-up rejector means has the further functions of:

(a) inhibiting said output means from generating output pulses corresponding to either of two successive main channel pulses whenever the time duration between the two corresponding fast channel pulses is less than the rise time of the main channel pulses; and (b) allowing said output means to generate an output pulse corresponding to the first of two successive main channel pulses and inhibiting said output mean from generating an output pulse corresponding to the second of said two successive main channel pulses whenever the time duration between the two corresponding fast channel pulses is greater than the rise time of the main channel pulses and less than the fall time of the main channel pulses.

3. A system as set forth in claim 1, wherein each detected signal has a step function waveform, and wherein said main channel pulse shaping means includes:
- first means for producing a first pulse having a waveform which is an RC differentiation of said step function waveform,
- second means for producing a second pulse having a waveform which is an RC integration of said first pulse,
- third means for producing a third pulse having a waveform which is an RC integration of said second pulse,
- fourth means for producing a fourth pulse having a waveform which is an RC integration of said third pulse,
- fifth means for producing a fifth pulse having a waveform which is a weighted addition of said second, third and fourth pulses.

4. A system as set forth in claim 3, wherein said fifth means has the function of producing said fifth pulse by adding said second, third and fourth pulses in the ratio of 0.324:0.168:1.

5. A system as set forth in claim 3, wherein said second means includes an inverting operational amplifier and said third and fourth means each includes a noninverting operational amplifier.

6. A system as set forth in claim 5 wherein said fifth means has the function of producing said fifth pulse by adding said second, third and fourth pulses in the ratio of 0.324:0.168:1.

7. A system as set forth in claim 1, wherein each detected signal has a step function waveform, and wherein said fast channel pulse shaping means includes:
- first means for responding to the presence of the step function waveform of said detected signals and for producing a single phase rectangular pulse in response to each presence of one of said step function waveform signals;
- second means for responding to the production of said single phase rectangular pulses and for producing a bipolar rectangular pulse in response to each production of one of said single phase rectangular pulses, said bipolar pulses each having an amplitude of its second half which is approximately 1/e times that of its first half, e being the base of the natural logarithmic system;
- third means for responding to the production of said bipolar rectangular pulses and for providing an RC integration of each of said bipolar pulses with the RC time constant of integration being equal to one-half the width of the bipolar pulse.

8. A system as set forth in claim 7 wherein:
said first means has the function of performing a subtraction operation between the step function waveform of said signal and a delayed version of said step function waveform, and
said second means has the function of performing a subtraction between the single phase rectangular pulse and a delayed version of said single phase rectangular pulse which is delayed by its width.

9. A system for generating a substantially symmetrical triangular pulse in response to the presence of a signal having a step function waveform, said system comprising:
- first means for producing a first pulse having a waveform which is an RC differentiation of said step function waveform,
- second means for producing a second pulse having a waveform which is an RC integration of said first pulse,
- third means for producing a third pulse having a waveform which is an RC integration of said second pulse,
- fourth means for producing a fourth pulse having a waveform which is an RC integration of said third pulse,
- fifth means for producing a fifth pulse having a waveform which is a weighted addition of said second, third and fourth pulses.

10. A system as set forth in claim 9, wherein said fifth means has the function of producing said fifth pulse by adding said second, third and fourth pulses in the ratio of 0.324:0.168:1.

11. A system as set forth in claim 9, wherein said second means includes an inverting operational amplifier and said third and fourth means each includes a noninverting operational amplifier.

12. A system as set forth in claim 11 wherein said fifth means has the function of producing said fifth pulse by adding said second, third and fourth pulses in the ratio of 0.324:0.168:1.

13. A system for generating a substantially symmetrical triangular pulse in response to a signal having a step function waveform, said system comprising:
- first means for responding to the presence of said signal having a step function waveform and for producing a single phase rectangular pulse in response to said presence of said step function waveform,
- second means for responding to the production of said single phase rectangular pulse and for producing a bipolar rectangular pulse in response to said production of said single phase rectangular pulse, said bipolar pulse having an amplitude of its second half which is approximately 1/e times that of its first half, e being the base of the natural logarithmic system,
- third means for responding to the production of said bipolar rectangular pulse and for providing an RC integration of said bipolar pulse with the RC time constant of integration being equal to one-half the width of said bipolar pulse.

14. A system as set forth in claim 13 wherein:
said first means has the function of performing a subtraction operation between the step function waveform of said signal and a delayed version of said step function waveform, and
said second means has the function of performing a subtraction between the single phase rectangular pulse and a delayed version of said single phase rectangular pulse which is delayed by its width.

* * * * *